United States Patent [19]

Moore

[11] Patent Number: 4,683,414
[45] Date of Patent: Jul. 28, 1987

[54] BATTERY ECONOMISING CIRCUIT

[75] Inventor: Paul A. Moore, Hove, England

[73] Assignee: U.S. Philips Corporation, New York, N.Y.

[21] Appl. No.: 757,234

[22] Filed: Jul. 22, 1985

[30] Foreign Application Priority Data

Aug. 22, 1984 [GB] United Kingdom ............... 8421315

[51] Int. Cl.⁴ ................. H01M 10/44; G05F 3/26
[52] U.S. Cl. ................................. 320/13; 323/315; 323/901
[58] Field of Search ............... 320/2, 13, 29, 30, 33, 320/34, 40, 47, 54, 55; 323/312, 315, 901

[56] References Cited

U.S. PATENT DOCUMENTS

| | | | |
|---|---|---|---|
| 3,787,757 | 1/1974 | Sherg | 30/54 X |
| 4,078,199 | 3/1978 | Chapron et al. | 323/901 X |
| 4,340,851 | 7/1982 | Nishikawa | 323/901 X |
| 4,342,953 | 8/1982 | Collins | 320/13 |
| 4,476,428 | 10/1984 | Iwasawa et al. | 323/901 X |
| 4,567,426 | 1/1986 | van de Plassche et al. | 323/901 X |
| 4,567,537 | 1/1986 | Kalkhof et al. | 323/312 X |

Primary Examiner—W. B. Perkey
Attorney, Agent, or Firm—Thomas A. Briody; William J. Streeter; Marianne R. Rich

[57] ABSTRACT

A battery economising circuit for use with one or more operating circuits, for example a part or parts of a radio circuit. In the battery economizing circuit an opposed current mirror type of current reference circuit determines entirely the current consumed by the operating circuit. A control circuit is connected to a point in the reference circuit from which current can be extracted. The control circuit in response to an OFF signal causes a portion of the current in the reference circuit to be diverted so that the reference circuit cannot sustain its normal ON- state and in response thereto assumes its OFF- state in which the operating and control circuits do not take current. The control circuit further includes means whereby current can be injected into the current reference circuit to cause it to assume its ON state and in consequence the operating circuit takes current.

In the case of there being several current reference circuits and associated control circuits, the inputs of the control circuits are all connected to a common signalling bus.

8 Claims, 9 Drawing Figures

BATTERY ECONOMISING CIRCUIT

The present invention relates to a battery economising circuit having particular, but not exclusive, application to battery powered equipment such as paging receivers and portable transceivers.

Many known battery economising circuits are based on the principle of disconnecting an operating circuit, for example an audio stage of a radio receiver, from a battery supply. Frequently a transistor operating in a common emitter mode is used as a switch for carrying the connection and disconnection of an operating circuit to and from a battery. A drawback to such an arrangement is that the voltage drop across the transistor is estimated to reduce the useful battery life by 5% in certain applications and the base current drawn when the transistor is in its ON state is estimated to reduce the useful battery life by a further 2%. Accordingly in certain situations the battery economising circuit may consume nearly as much current as is saved by applying battery economising to the operating circuit.

SUMMARY OF INVENTION

It is an object of the present invention to reduce significantly the current consumed by a battery economising circuit.

According to the present invention there is provided a battery economising circuit comprising a current reference circuit which determines entirely the current consumed by an operating circuit, the current reference circuit being of an opposed current mirror type, and a control circuit coupled to a point or points in the current reference circuit from which current can be extracted, said control circuit in response to an OFF signal diverting a portion of the current in the reference circuit so that it is unable to sustain its normal ON- state current and in response thereto assumes its OFF state thereby causing the operating circuit and the cotnrol circuit not to draw current.

If desired the battery economising circuit made in accordance with the present invention may further include means for injecting current into the reference circuit in response to an ON signal to ensure a rapid transition to an ON state.

By using an opposed current mirror type of reference circuit the battery is continuously connected to the operating circuit until removed for recharging or replacement thus avoiding current losses in a semiconductor switch. The amount of current consumed in switching -on or -off the current supplied to the operating circuit is almost negligible. Additionally the turn-off and turn-on times are so short that as far as speech are concerned, they can be regarded as instantaneous.

In one embodiment of the present invention the control circuit comprises a junction transistor to the base circuit of which a control signal is applied. An advantage of using a junction transistor for this purpose is that the control signals are well-defined and can be made compatible with voltages used in logic circuitry which may for example be used for obtaining timing signals for switching on and off a receiver such as a paging receiver.

In another embodiment of the present invention, the control circuit comprises first and second transistors of the same conductivity type connected as a long tailed pair with their emitters interconnected. The collector of the first transistor and the interconnected emitters are connected into a current path between the opposed current mirrors. The collector of the second transistor is coupled to a voltage supply rail. A control input is connected to the base of the first transistor and the base of the second transitor is connected to a reference voltage point. In operation when the voltage at the control input is greater than the reference voltage then the circuit is in an ON-state and when the voltage is below the reference voltage, the circuit is in an OFF-state. Thus varying the value of the reference voltage enables some flexibility to be obtained in the operation of the circuit.

In the event of there being two or more control circuits, each one having its associated reference circuit, then a common signalling bus linking the inputs of the control circuits may be provided.

DESCRIPTION OF THE FIGURES

The present invention will not be described, by way of example, with reference to the accompanying drawings wherein.

In the drawings the same reference numerals have been used to indicate the corresponding parts.

DESCRIPTION OF THE PREFERRED EMBODIMENTS

Figure 1:
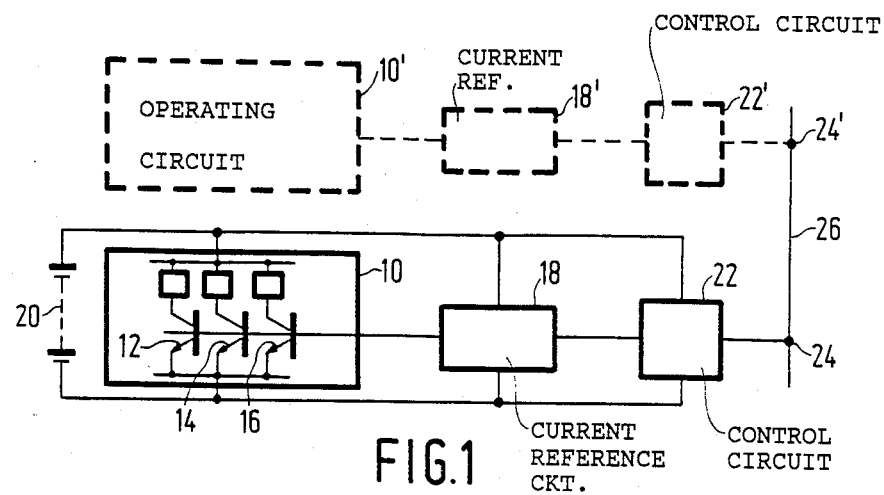
FIG. 1 is a block schematic circuit diagram of an operating circuit and battery economising circuit made in accordance with the present invention.

Referring to FIG. 1 an operating circuit 10 which may comprise a part, say an audio section, of a radio receiver includes a number of operative portions the operation of each of which is dependant on a current drawn by certain transistors 12, 14, 16. The current drawn is regulated by a current reference circuit 18 which sets its current substantially independently of the terminal voltage of a battery 20 connected to the circuit 10. The current reference circuit 18 which is of an opposing current mirror type has two stable states namely ON when the current is I and OFF when the current is zero. This type of circuit is known per se from "Integration of Analogue Electronic Circuits" by J. Davidse, published by Academic Press pages 95 to 98. With this type of reference circuit it is customary to warn designers that when it is powered-up in the normal way by connecting the battery 20 the reference circuit may assume its zero current state and not its other intended stable state.

The state of the current reference circuit 18 can be controlled predictably by connecting a control circuit 22 to a point in the current reference circuit 18 from which current can be extracted. The control circuit 22 in response to a logic "OFF" signal on its input 24 diverts a portion of the current in the reference circuit 18 causing it to adopt an OFF-state thereby causing the operating circuit 10 and the control circuit 22 to take no current. Current is drawn by the control circuit 22 only while the reference circuit 18 changes from an ON state to an OFF state and vice versa. In order to induce the reference circuit 18 quickly to assume its ON state in which the operating circuit 10 draws current, charge is injected by the control circuit 22.

Although several operating circuits can be associated with one current reference circuit 18, if it should be necessary to provide a second current reference circuit 18' to control the current supplied to another operating circuit 10' then this will have its own control circuit 22'. However the control signal inputs 24, 24' can be interconnected by a common signalling bus 26 connected to a logic circuit (not shown).

Figure 2:
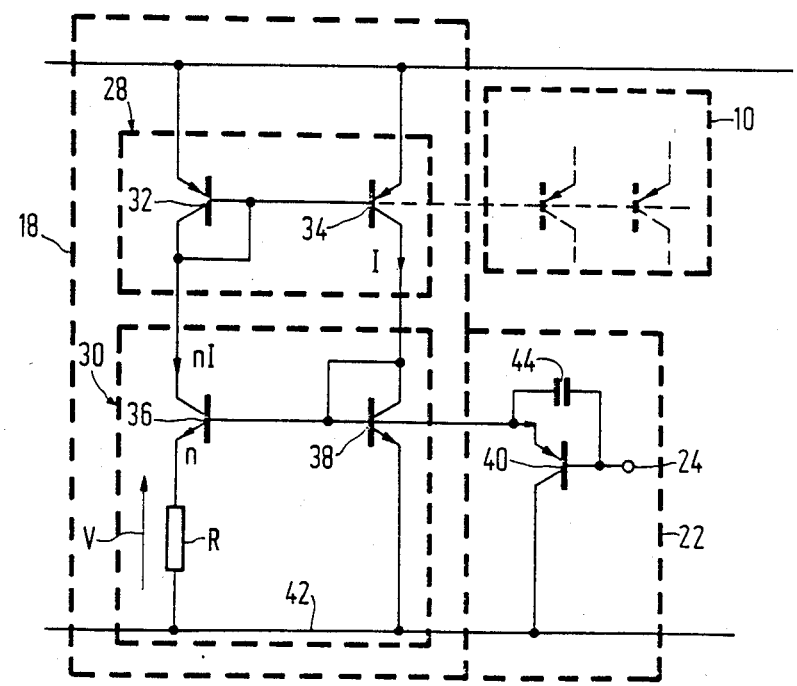
FIG. 2 is a schematic circuit diagram of a simplified embodiment of the battery economising circuit made in accordance with the present invention.

FIG. 2 shows a simplified current reference circuit 18 coupled to the operating circuit 10 and one embodiment of the control circuit 22. The circuit 18 comprises two opposing current mirror circuits 28, 30. The circuit 28 comprises two identical PNP transistors 32, 34 whose base electrodes are interconnected. The base and collector electrodes of the transistor 32 are interconnected so that it operates as a diode. The circuit 30 comprises two non-identical NPN transistors 36, 38. The letter "n" associated with the transistor 36 indicates that it has n times the emitter area of the transistor 38 or that there are n times the number of transistors of a type similar to the transistor 38. The base and collector electrodes of the transistor 38 are interconnected and connected to the collector of the transistor 34. The collector the transistor 36 is connected to the collector/base electrodes of the transistor 32. A resistance R is connected in the emitter circuit of the transistor 36.

By interconnecting the circuits 28, 30 as specified then a current stable situation exists with the current gain of the lower circuit 30 being reduced to unity by the voltage drop, V, across the resistor R.

In this current stable situation $$I.R = (kT/q) \ln(n)$$

Hence the current I is proportional to 1/R and also to ln(n). The current I is dependent on the supply voltage only by virtue of second order effects which are not included in the equation. A stable state exists at I=0 because the gain of the transistors falls to zero at I=0; under these conditions, the equation is invalid.

The illustrated control circuit 22 comprises a single PNP transistor 40 whose emitter-collector path is connected between the base electrodes of the transistors 36, 38 and a voltage rail 42. A low value (a few picofarads) capacitor 44 is connected between the emitter and base electrodes of the transistor 40.

Assuming that the current reference circuit 18 is in an ON state then a reference current I is established independently of the supply voltage and the (or each) operating circuit 10 draws a current I. In this condition a voltage of approximately 0.6 volts exists between the emitter of the transistor 40 and the rail 42. If the control signal on the control input 24 goes from high to low which in the case of FIG. 2 means going negative with respect to the voltage on the rail 42, then a portion of the current I is diverted to the emitter circuit of the transistor 40. As a result of regenerative action the reference circuit 18 is unable to sustain the ON-state current and very rapidly it assumes its OFF state in which I=0 and in consequence the current in the associated operating circuit 10 goes to zero thereby making it non-operative and also the current through the emitter-collector path of the transistor 40 goes to zero.

The portion of the current diverted out of the reference circuit is dependent upon the value of n and in an exemplary circuit when n=2, the portion was 17%.

The value of n is usually kept small to avoid excessive noise and if increased a larger portion of the current must be diverted.

Figure 4A:
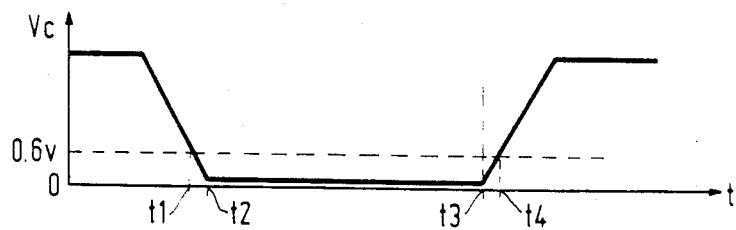
FIGS. 4A to 4D are waveform diagrams which help illustrate the operation of the circuit shown in FIG. 3, and FIGS. 5 and 6 are schematic circuit diagrams of two further embodiments of the present invention.
Figure 4B:
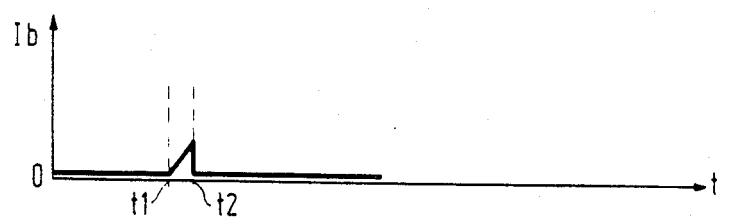
Figure 4C:
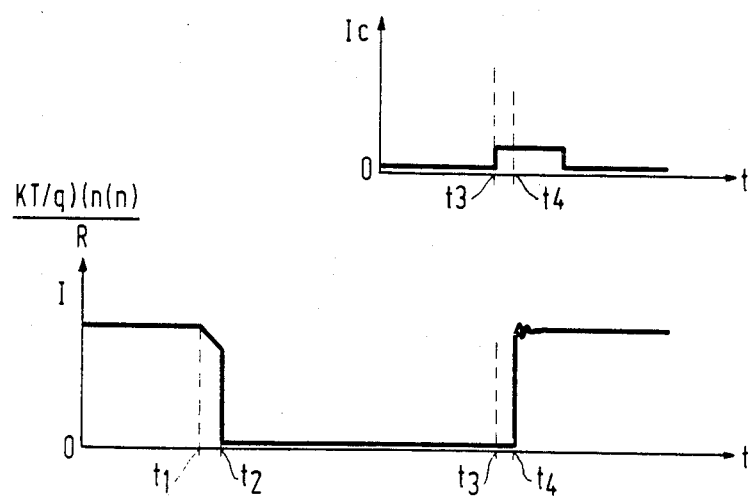
Figure 4D:
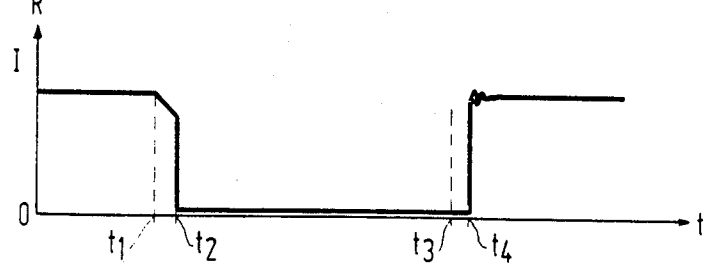

In order to restore the operative current to the operating circuit 10, the control signal on the input 24 is changed from a low to a high value and any residual charge on the capacitor 44 and the transistor junctions is injected into the reference circuit 18 so that it switches to its ON condition. This is illustrated in FIG. 4C.

Figure 3:
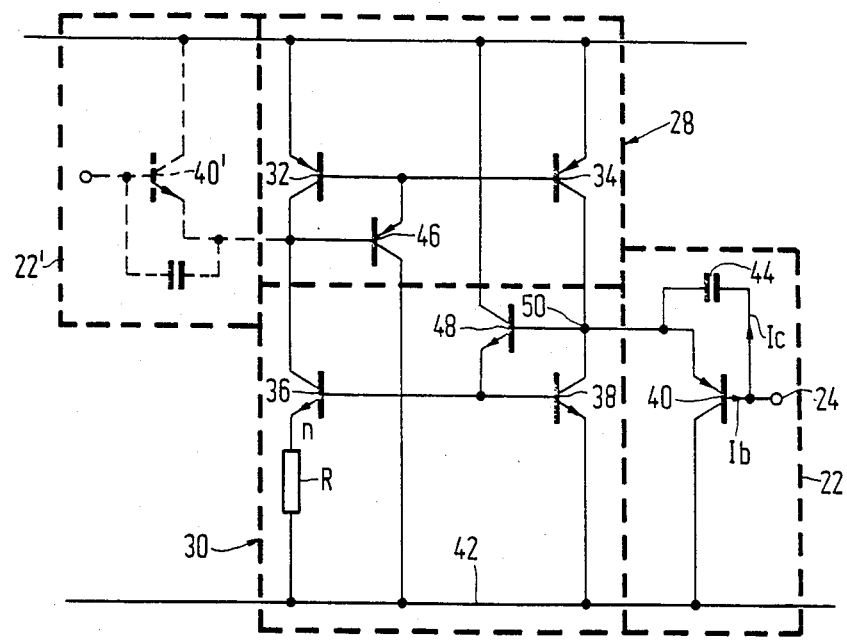
FIG. 3 is a schematic circuit diagram of a practical embodiment of the battery economising circuit made in accordance with the present invention.

The practical circuit shown in FIG. 3 differs from the simple circuit of FIG. 2 by the base-collector interconnections of the transistors 32, 38 being replaced by emitter follower transistors 46, 48, respectively, and the emitter of the transistor 40 being connected to a junction 50 of the collector of the transistor 38 and the base of the transistor 48. The provision of the emitter follower transistors 46, 48 avoids the accuracy of the current I being degraded by the operating circuit 10 comprising a large number of transistors. Connecting the emitter of the transistor 40 to the junction 50 means that a voltage difference of 1.2 V exists between the emitter and the rail 42. This has the advantage that the control voltage does not have to go negative to turn-off the current reference circuit and in consequence the reference circuit 18 and the control circuit 22 are less likely to be turned-on by transients on the input 24 but this depends entirely on the exact level of the control signal during the "OFF" condition.

Turning now to FIGS. 4A to 4D, when the reference circuit is on, the control voltage Vc on the input 24 is high and no current is drawn by the transistor 40 as its base/emitter junction is reversed biased. At time $t_1$, the control voltage changes to a low value and in so doing the transistor 40 is forward biased and diverts current I from the reference circuit 18. Once the circuit 18 is unable to sustain its ON-state due to loss of current then it assumes its OFF state in which no current is drawn by the transistor 40 and the operating circuit 10. This is essentially a static process. The base current Ib (FIG. 4B) drawn by the transistor 40 when conductive between t1 and t2 is typically less than 1% of the ON current of the reference circuit.

Conversely when at $t_3$ the control voltage Vc goes high again, then at a voltage between 0.6 and 1.2 volts, any charge on the capacitor 40 is injected into the reference circuit 18 causing it to assume its ON state so that I substantially instantaneously increases to a high level at $t_4$. The operating circuit 10 draws current again and becomes operative. This a dynamic process in that the current Ic (FIG. 4C) is a function of the rate the control signal moves.

In the drawing the control circuit 22 comprises the PNP transistor 40, however, the control circuit 22' may alternatively be a NPN transistor 40' whose emitter-collector path is connected in parallel with that of the transistor 32.

Figure 5:
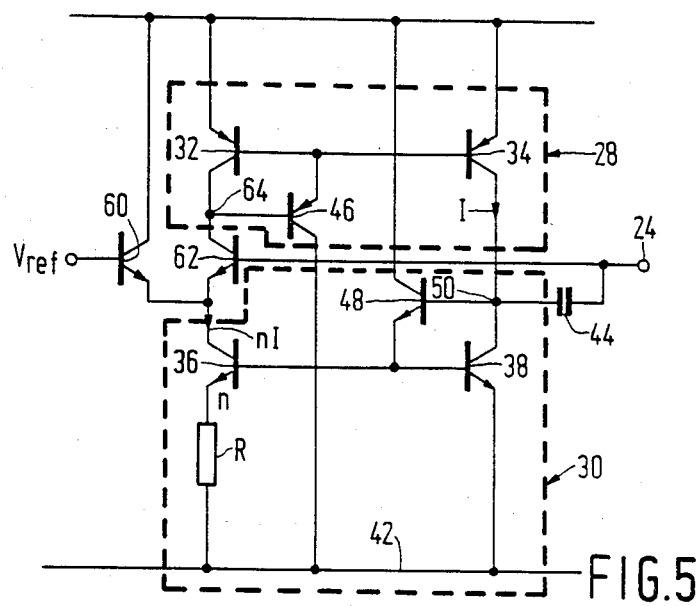
Figure 6:
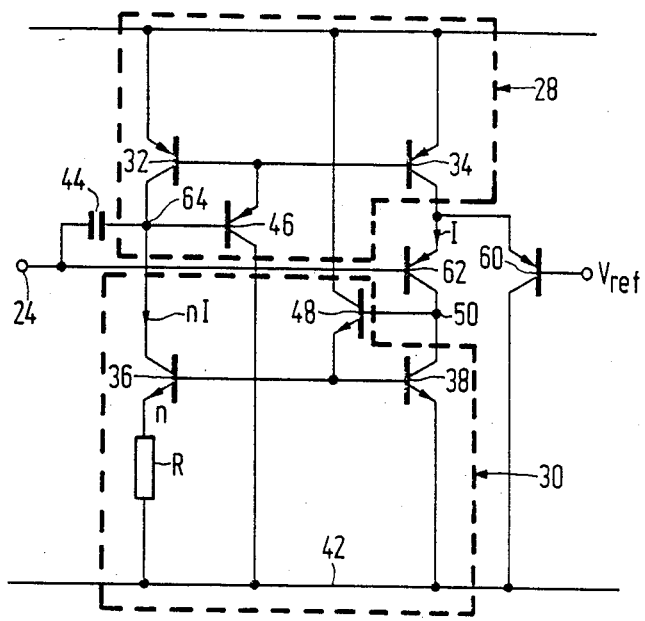

The circuits of FIGS. 5 and 6 are alternatives to each other and work on the principle that a reference voltage $V_{ref}$ is applied to the baes electrode of a transistor 60 of a long tailed pair and the control voltage Vc is applied via the control input 24, to the base electrode of the other transistor 62 of the long tailed pair and is compared with $V_{ref}$. Whilst Vc is greater than $V_{ref}$ by at least 100 mV the transistor 62 conducts and the current I is maintained, however when $V_{ref}$ is greater than Vc then the situation is reversed and the current I is quickly reduced to zero.

Referring more particularly to FIG. 5, the transistors 60, 62 are NPN ones with their commonly connected emitters connected in the collector circuit of the transistor 36. The collector of the transistor 60 is connected to the supply rail whilst the collector of the transistor 62 is connected to a junction 64 of the collector of the transistor 32 and the base of the transistor 46. The capacitor 44 is coupled between the control input 24 and the junction 50.

In the case of FIG. 6, the transistors 60, 62 are PNP type and their arrangement in the circuit is effectively the opposite to that as shown in FIG. 5 and therefore a detailed descrption will be omitted in the interests of brevity.

The principle of operation of the circuits shown in FIGS. 5 and 6 has already been described and some further details will now be given.

When the control input voltage is higher than $V_{ref}$, transistor 62 is conductive and the transistor 60 is non-conductive. When the control signal goes from high to low then the transistor 60 becomes conductive and diverts the current in the collector-emitter paths of the transistors 32 and 62 to the voltage supply rail via the transistor 60. As a result of regenerative action the reference circuit comprising the opposing current mirror circuits 28, 30 is unable to sustain the ON-state current and very rapidly assumes its OFF-state in which I=0.

To restore the operative current I to an external circuit (not shown), the control signal Vc is changed from a low to a high value and in so doing the transistor 60 is cut-off and the transistor 62 becomes fully conductive. Any residual charge on the capacitor 44 is injected into the circuit to assist in its switching ON.

Changing the value of $V_{ref}$ alters the level of the control voltage required to cause the circuits of FIGS. 5 and 6 to change states between ON and OFF.

I claim:

1. A current reference circuit for switching a current of an operating circuit comprising:
   first and second opposing current mirror circuits, connected together and between first and second power supply terminals, said first and second mirror circuits having a total loop gain of substantially unity, said connected current mirrors having first and second stable current states; said first state corresponding to substantially zero current level passing between said first and said second mirror circuits; and
   a control circuit connected to switch said current mirrors between said first and second stable states comprising means for momentarily diverting current around one of said mirror circuits whereby said first state is assumed, and for injecting current into an input of said one mirror circuit whereby said second non-zero current state is assumed.

2. The circuit of claim 1 wherein said control circuit draws substantially zero current after momentarily diverting said current.

3. The circuit of claim 2 wherein said control circuit is a transistor having an emitter coupled to one of said mirror circuits, a base connected to receive a control signal, a collector connected to one of said rails, and a capacitor connected across said emitter and base.

4. A circuit as claimed in claim 1 wherein said control circuit comprises first and second transistors of the same conductivity type connected as a long tailed pair with their emitters interconnected, the collector of the first transistor and said interconnected emitters are connected into a current path between the opposed current mirrors, the collector of the second transistor is coupled to a voltage supply rail, a control input is coupled to the base of the first transistor and wherein the base of the second transistor is connected to a reference voltage point.

5. A current reference circuit for switching a current of an operating circuit comprising:
   a first current mirror circuit comprising a pair of transistors of the same conducting type, having common bases, and common emitters connected to a first rail of a power supply, one of said transistors having its base and collector connected together, the other of said transistors having a free collector;
   a second current mirror circuit comprising a second pair of transistors having a conductivity type opposite to said first pair of transistors conductivity type, one of said transistors serially connecting a second rail of said power supply through a resistor to said first current mirror circuit one transistor collector and base, and the other of said second pair of transistors connecting said free collector of said first transistor pair to said second rail, said bases of said second pair of transistors being connected together and to said one transistor free collector of said first transistor pair; and
   a control circuit for injecting current into the base of one of said transistors having a base connected to a collector, whereby the current mirrors assume a pre-established current state and for momentarily diverting current from the collector of one of said transistors having its base connected to its collector of said first current mirror, whereby said current mirrors assume an off-state, and said mirrors and control circuit draw substantially no current.

6. A circuit as claimed in claim 5, wherein said control circuit for injecting current comprises a capacitor connected to supply current to the collector of one of said transistors having a base connected to a collector.

7. A circuit as claimed in claim 5, wherein the control circuit comprises a junction transistor connected by its emitter electrode to the colelctor of one of said transistors having a base connected to a collector.

8. A circuit as claimed in claim 7, wherein said current injecting circuit comprises a capacitor connected between the emitter and base electrodes of said junction transistor.

* * * * *